United States Patent [19]

Endoh et al.

[11] Patent Number: 5,088,060
[45] Date of Patent: Feb. 11, 1992

[54] ELECTRICALLY ERASABLE PROGRAMMABLE READ-ONLY MEMORY WITH NAND MEMORY CELL STRUCTURE

[75] Inventors: Tetsuo Endoh, Yokohama; Riichiro Shirota, Kawasaki; Masaki Momodomi, Yokohama; Tomoharu Tanaka, Yokohama; Fujio Masuoka, Yokohama; Shigeyoshi Watanabe, Yokohama, all of Japan

[73] Assignee: Kabushiki Kaisha Toshiba, Kawasaki, Japan

[21] Appl. No.: 634,325

[22] Filed: Dec. 26, 1990

Related U.S. Application Data

[63] Continuation of Ser. No. 489,967, Mar. 7, 1990, Pat. No. 4,996,669.

[51] Int. Cl.$^5$ ............................................. G11C 11/40
[52] U.S. Cl. ........................... 365/185; 365/189.01; 365/230.01
[58] Field of Search ............... 365/189.01, 185, 190, 365/189.05, 230.01

[56] References Cited

U.S. PATENT DOCUMENTS

| | | | |
|---|---|---|---|
| 4,233,526 | 11/1980 | Kurugi et al. | 365/184 |
| 4,677,590 | 6/1987 | Arakawa | 365/185 |
| 4,694,317 | 9/1987 | Terula | 365/185 |
| 4,996,669 | 2/1991 | Endoh et al. | 365/189.01 |

FOREIGN PATENT DOCUMENTS

0134390 10/1981 Japan .............................. 365/189.05

Primary Examiner—Terrell W. Fears
Attorney, Agent, or Firm—Oblon, Spivak, McClelland, Maier & Neustadt

[57] ABSTRACT

An electrically erasable programmable read-only memory with a NAND cell structure has parallel bit lines, and memory cells defining NAND cell blocks, each of which has a series-circuit of memory cell transistors. Each transistor has a floating gate and a control gate. Parallel word lines are connected to the control gates of the cell transistors. The first, second and third intermediate voltages are used in the data write mode: the first voltage is lower than the "H" level voltage and higher than the "L" level voltage; the second and third voltages are higher than the first voltage and lower than the "H" level voltage. Data is written into a selected memory cell transistor of a NAND cell block, by applying the "H" level voltage to a word line connected to the selected transistor, applying the second voltage to the remaining unselected word lines, applying a corresponding bit line associated with the selected transistor with one of the first and third voltages which is selected in accordance with a logic level of the data, and applying unselected bit lines with the third voltage, whereby carriers are moved by tunneling from or to the floating gate of the selected memory cell transistor.

21 Claims, 10 Drawing Sheets

ELECTRICALLY ERASABLE PROGRAMMABLE READ-ONLY MEMORY WITH NAND MEMORY CELL STRUCTURE

This is a continuation of application Ser. No. 07/489,967, filed on Mar. 7, 1990, now U.S. Pat. No. 4,996,669.

BACKGROUND OF THE INVENTION

1. Field of the Invention

The present invention relates to non-volatile semiconductor memory devices and, in more particular, to an erasable programmable read-only memory with a large data storage capacity.

2. Description of the Related Art

With the increasing needs for high performance and reliability of digital computer systems, development of semiconductor memories with large capacity have been demanded strongly, which can replace existing nonvolatile data storage devices for digital computer systems, such as a magnetic floppy diskette drive unit, a fixed disk unit, or the like. A presently-available erasable programmable read-only memory has technical advantages such as higher reliability and a higher data write/read rate than those of the magnetic data storage devices; however, the data storage capability of the memory of this type is not so large as to replace the magnetic data storage devices.

In a conventional electrically erasable programmable read-only memory (to be referred to as "EEPROM" hereinafter), since each memory cell is typically arranged to include two transistors, it cannot be expected to provide a high integration density that can provide a large capacity capable of replacing the aforementioned peripheral data storage devices.

Recently, an EEPROM with "NAND cell" structure has been developed as a non-volatile semiconductor memory which is highly integrated and therefore has a large data storage capacity. According to such memory of this type, each of memory cells typically consists of only one transistor having a floating gate and a control gate. Only one contact portion is formed between an array of memory cells, which are arranged on a substrate to constitute the "NAND cell" structure, and the corresponding bit line associated therewith. A cell area on substrate surface can thus be reduced much smaller than that of a conventional EEPROM, thereby improving the integration density of the EEPROM.

The NAND type EEPROM, however, suffers from the generation of current leakage due to the "inversion phenomenon" beneath a field isolation region between adjacent NAND cell blocks of neighboring bit lines. Such current leakage causes programming errors, such as writing data in an erroneous memory cell other than a selected memory cell, writing erroneous data in the selected memory cell, so that the operational reliability will be degraded.

SUMMARY OF THE INVENTION

It is therefore an object of the present invention to provide a new and improved non-volatile semiconductor memory device.

In accordance with the above object, the present invention is addressed to a specific erasable programmable semiconductor memory comprising a semiconductive substrate, parallel bit lines formed above the substrate, and rewritable memory cells connected to the bit lines. These memory cells are arranged so as to define NAND cell blocks, each of which has a series-circuit of memory cell transistors. Each memory cell transistors has a carrier storage layer, such as a floating gate, and a control gate layer. Parallel word lines are formed above the substrate to intersect with the bit line, and connected at the control gates of the NAND cell transistors. A control circuit is provided for generating a first intermediate voltage which is lower than a "H" level voltage of said device and higher than a "L" level voltage of said device, for generating second and third intermediate voltages which are higher than the first voltage, and for writing data into a selected memory cell transistor of a selected NAND cell block, by applying the "H" level voltage to a word line connected to said selected memory cell transistor, applying the second voltage to remaining word lines kept unselected, applying a corresponding bit line associated with said selected memory cell transistor with one of the first and third voltages which is selected in accordance with a logic level of the data to be written in said selected memory cell transistor, and applying unselected bit lines with the third voltage, whereby carriers are moved by tunneling from or to the carrier storage layer of said selected memory cell transistor so that the data is written thereinto.

The present invention and its objects and advantages will become more apparent in a detailed description of preferred embodiments to be presented hereinafter.

BRIEF DESCRIPTION OF THE DRAWINGS

In the detailed description of preferred embodiment of the present invention presented below, reference is made to the accompanying drawings of which:

FIG. 12 is a diagram showing the waveforms of main electrical signals that are generated in main parts of the EEPROM in FIG. 8 in a modified data write mode.

DETAILED DESCRIPTION OF THE PREFERRED EMBODIMENTS

Figure 1:
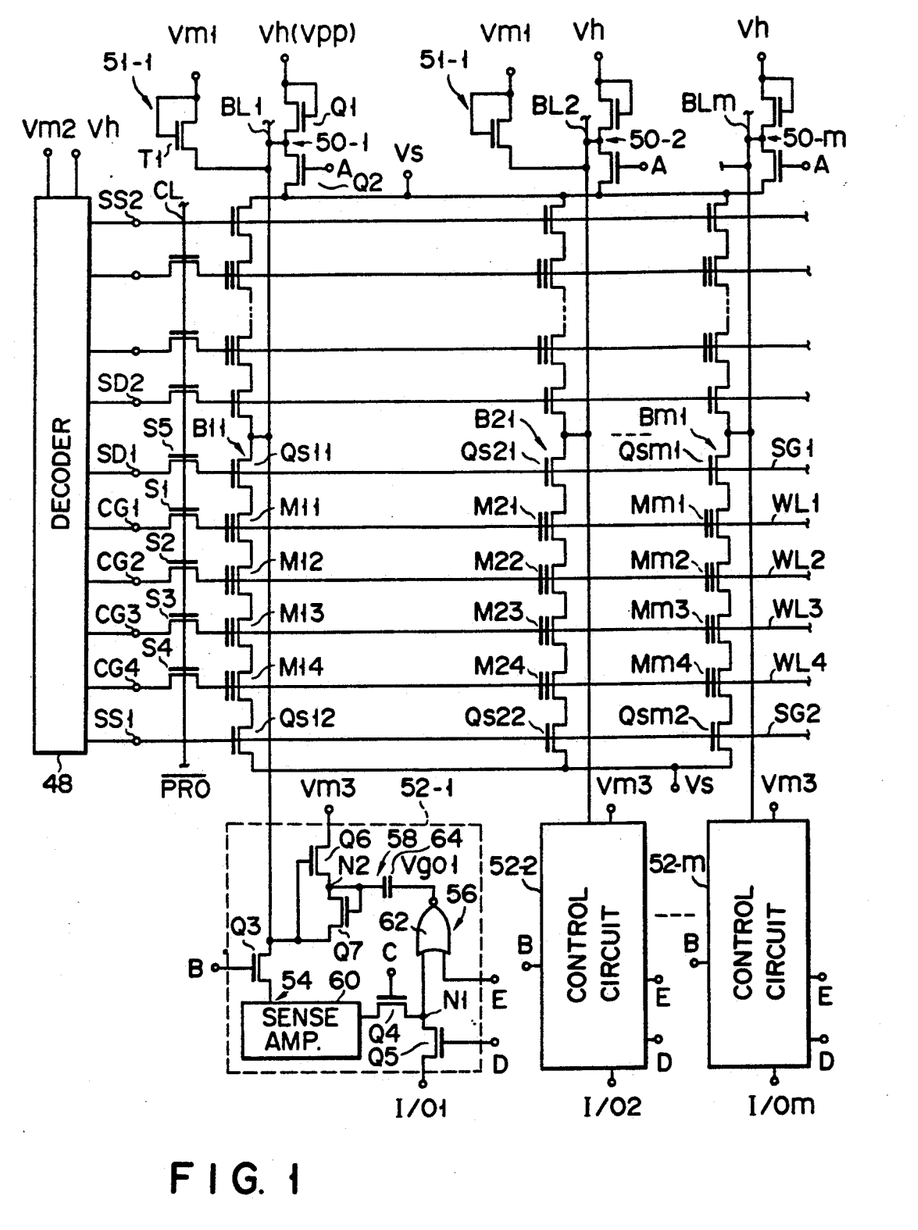
FIG. 1 is a diagram showing the main part of a circuit arrangement of an electrically erasable programmable read-only memory (EEPROM) in accordance with a preferred embodiment of the present invention.
Figure 2:
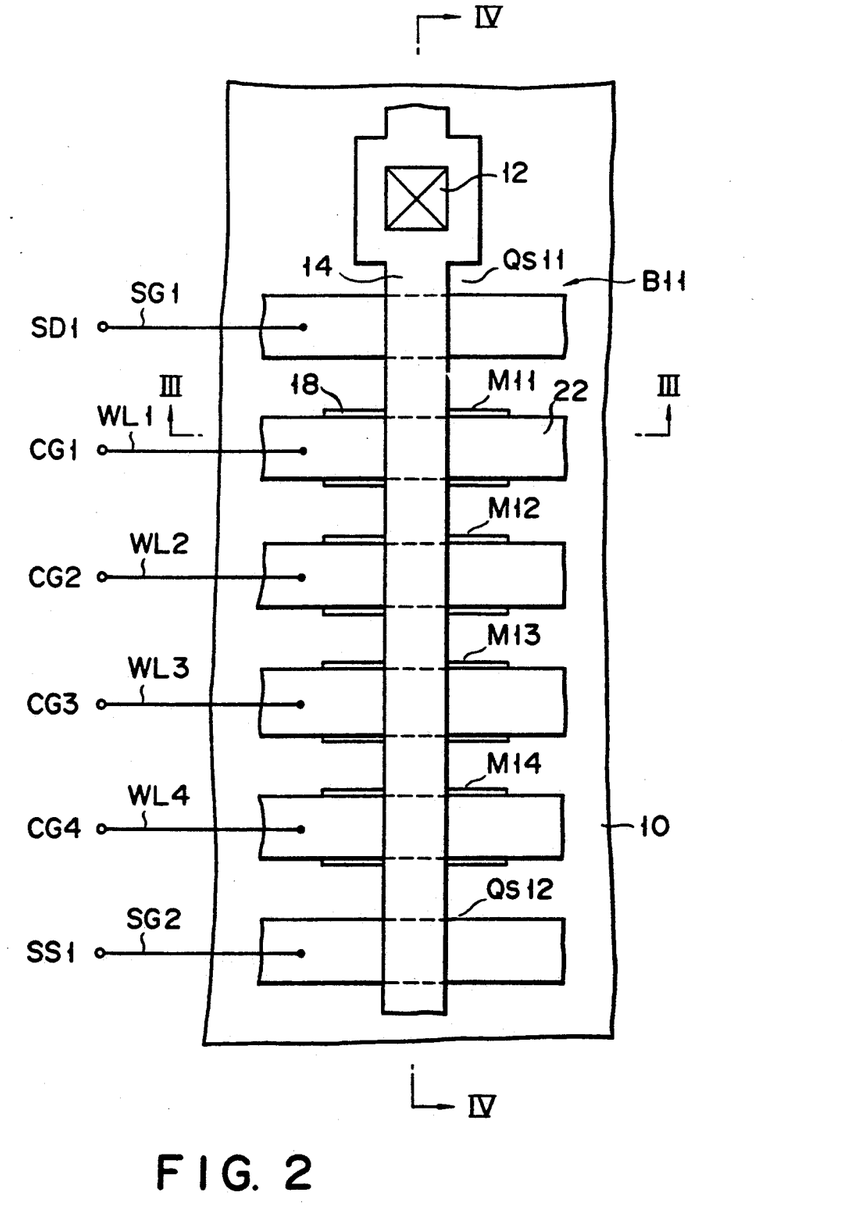
FIG. 2 is a diagram showing a plan view of a NAND cell block provided in the EEPROM shown in FIG. 1 and having memory cell transistors connected in series with one another to constitute a "NAND cell block" together with selection transistors.

Referring now to FIG. 1, an electrically erasable programmable read-only memory (EEPROM) according to a preferred embodiment of the present invention has a cell array section, which is formed on chip substrate 10 of P type conductivity (see FIG. 2). A selected number of parallel bit lines BL1, BL2, ..., BLm (reference symbol "BLi" is used to denote an arbitrary one of the bit lines hereinafter) are insulatively formed above the substrate. Each of these bit lines BLi is connected with a plurality of memory cells. The cells are divided into subarrays (to be referred to as "NAND cell blocks" or simply "NAND cells" hereinafter) B11, B12, ..., (reference symbol "Bij" is used to denote an arbitrary one of the cell blocks), each of which has selection transistors Qs1 and Qs2 and a predetermined number of memory cells M. Selection transistors Qs are constituted by single gate type MOSFETs. Each of memory cells M is basically constituted by a double gate MOSFET which has a floating gate and a control gate.

A series array of transistors of each NAND cell block Bij is connected at its one end (i.e., the drain of the memory cell transistor M11) to corresponding bit line BLi through first selection transistor Qs1, and is grounded at the other end thereof (i.e., the source of memory cell transistor M14) to substrate voltage Vs through second selection transistor Qs2. In this embodiment, memory cells M of each cell block Bij consist of memory cell transistors M1, M2, ..., Mn connected in series with one another thereby to constitute a so-called "NAND cell" structure. In the following description, number "n" of memory cell transistors included in each cell block is set to be decreased number "4" only for the sake of illustrative simplicity; this number, however, will be set to be "8" or "16" in an actual application.

Parallel word lines WL1, WL2 ..., WL4 are insulatively formed above the substrate so as to cross or intersect with bit lines BL. Selection transistors Qs and memory cell transistors M are connected to nodes of bit lines BL and word lines WL as shown in FIG. 1, respectively, thereby to constitute a cell matrix. Note that lines SG1 and SG2 connected to selection transistors Qs1 and Qs2 of each cell block Bij, respectively, are sometimes called "gate control lines" in this description.

As shown in FIG. 2, one NAND cell block (e.g., "B11" has contact hole 12 above lightly-doped P type silicon chip substrate 10. More specifically, connection line (aluminum wiring layer) 14 insulatively extends above a series connection of transistors Qs and M. Wiring line 14 overlaps the gates of transistors Qs and M included in cell block B11. It is to be noted in FIG. 2 that the floating gate in each memory cell transistor looks wider than the control gate (word line) for illustrative purpose only and that in the actual device it is substantially same in width as the control gate since it is formed using self-aligning technique.

Figure 3:
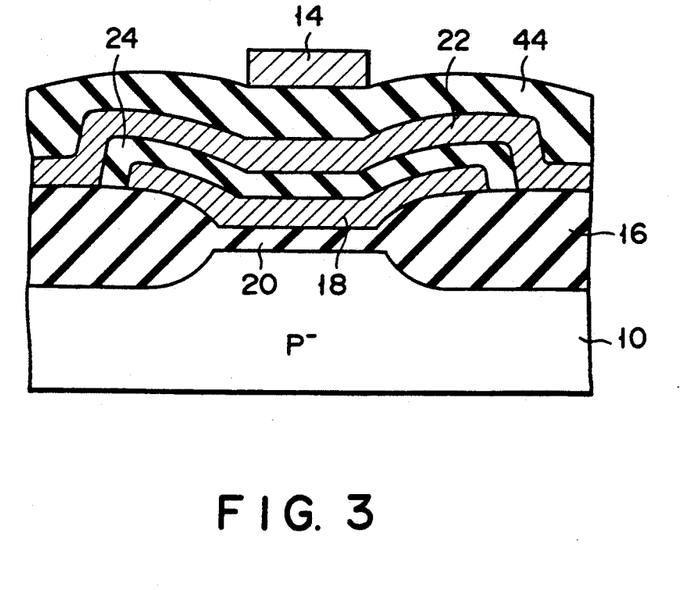
FIG. 3 is a diagram showing a cross-sectional arrangement of the NAND cell block shown in FIG. 2 taken along line III—III thereof.
Figure 4:
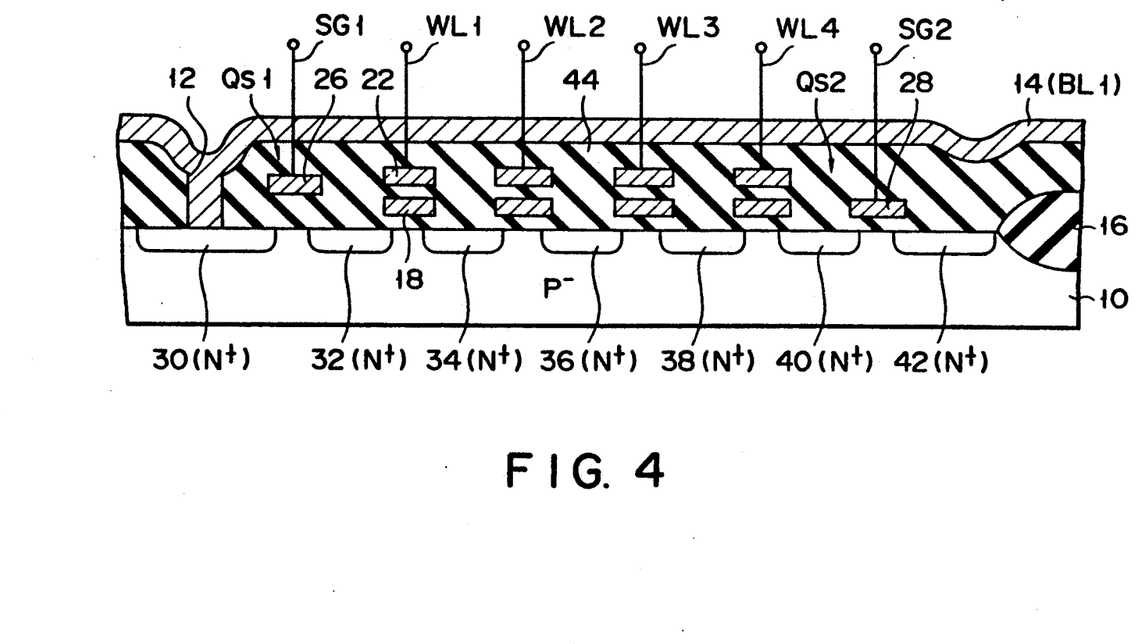
FIG. 4 is a diagram showing a cross-sectional arrangement of the NAND cell block shown in FIG. 2 taken along line IV—IV thereof.

Referring to sectional views of FIGS. 3 and 4, the transistor array of NAND cell block B11 is formed on a substrate surface area surrounded by insulative layer 16, formed on substrate 10, for isolating elements. As is most clearly shown in FIG. 3, MOSFET M11 constituting one memory cell (the remaining memory cells have the same arrangement) has first polycrystalline silicon layer 18 insulatively disposed above substrate 10 by thermal oxide insulative layer 20 and second polycrystalline silicon layer 22 insulatively disposed above layer 18 by thermal oxide insulative layer 24. Layer 18 serves as a floating gate of MOSFET Mij, whereas layer 22 serves as a control gate of MOSFET Mij. Control gate layer 22 is connected to the corresponding word line (in the case of memory cell M11, word line WL1). As shown in FIG. 3, floating gate 18 extends onto the element isolation region, whereby in each cell Mi, coupling capacitance Cfs between floating gate 18 and substrate 10 is set smaller than coupling capacitance Cfc between floating gate 18 and control gate 22, so that data writing/erasing is enabled by only movement of electrons by a tunneling effect between floating gate 18 and substrate 10.

First selection transistor Qs11 has polycrystalline silicon layer 26 insulatively disposed above substrate 10. Layer 26 serves as a control gate of selection transistor Qs11. Similarly, second selection transistor Qs12 has polycrystalline silicon layer 28 insulatively disposed above substrate 10, which serve as a control gate of selection transistor Qs12.

As shown in FIG. 4, heavily-doped N type (N+ type) diffusion layers 30, 32, 34, 36, 38, 40, and 42 are formed to slightly overlap the gates of transistors Qs and M. N+ diffusion layers act as sources and drains of the corresponding transistors. For example, layers 30 and 32 serve as the drain and source of selection transistor Qs11; similarly, layers 32 and 34 serve as the drain and source of cell transistor M11.

The above layer structure is entirely covered with CVD insulative layer 44. As shown in FIG. 4, a throughhole is formed in layer 44 so as to act as contact hole 12 for a series transistor array. Contact hole 12 is located on source diffusion layer 32 of selection transistor Qs11. Aluminum wiring layer 14 runs on layer 44 and is in contact with drain diffusion layer 30 of transistor Qs1 by contact hole 12. Layer 14 is selectively connected to a data input/output line.

Referring back to FIG. 1, word lines WL1, WL2, WL3, and WL4 are connected to control terminals CG1, CG2, CG3, and CG4 through switching transistors S1, S2, S3, and S4, respectively. Gate control line SG1 is connected to control terminal SD1 through switching transistor S5. Line SG2 is directly connected to control terminal SS1. Transistors S1 to S5 are connected at their gates to control line CL, to which control signal $\overline{PRO}$ is supplied. Decoder circuit section 48 is connected to word lines WL and control lines SG at terminals SD1, CG1, CG2, CG3, CG4, and SS1.

Each of bit lines BLi is connected at its one end to intermediate voltage generators 50-i and 51-i (i=1, 2, ...), and is connected at the other end to peripheral control circuit 52-i. Generator 50 includes a series-circuit of two MOSFETs Q1 and Q2. The gate of FET Q1 is connected to its drain. FET Q1 is applied with boosted voltage Vpp (in this embodiment, 20 volts) at its drain. The voltage Vpp is applied as "H" level voltage Vh to bit line BL1 through FET Q1. FET Q2 has a gate connected to terminal A. FET Q2 serves as a discharging transistor through which bit line carriers are to be discharged.

Intermediate voltage generator 51-i has a MOSFET T1 which is provided as a charging transistor and has a gate electrode connected to its drain, to which a first intermediate voltage Vm1 is supplied. Bit line BLi is connected to intermediate voltage generator 51-i at a source of MOSFET T1. First intermediate voltage Vm1 has a potential of 6 volts, for example.

A second intermediate voltage Vm2 is supplied to decoder circuit 48 together with "H" level voltage Vh. Second intermediate voltage Vm2 is 10 volts, for example. Decoder 48 may apply each of lines WL and SG with one of "H" level voltage Vh and second intermediate voltage Vm2, selectively. Second intermediate voltage Vm2 is used in the data write mode; "H" level voltage Vh is used in both the data write mode and the data erase mode.

Peripheral control circuit 52 includes sense circuit section 54, data discriminating circuit section 56, and write control circuit section 58. Sense circuit section 54 has MOSFET Q3 having a gate connected to terminal B and turned on in a read mode of the EEPROM, sense amplifier 60 connected to bit line BL1 through FET Q3, MOSFET Q4 having a gate connected to terminal C, connected to the output of amplifier 60, and turned on in the read mode of the EEPROM, and MOSFET Q5 having a gate connected to terminal D and connected between FET Q4 and input/output line I/O1. Data discriminating circuit section 56 includes NOR gate 62 having a first input connected to common node N1 of FETs Q4 and Q5, and a second input connected to terminal E. Write control circuit section 58 includes a series circuit of two MOSFETs Q6 and Q7 and capacitor 64 that is connected to the output of NAND gate 62. FET Q6 is applied at its drain with third intermediate voltage Vm3 (in this embodiment, 10 volts). The gate of FET Q6 is connected to the source of FET Q7 and bit line BL1. The gate of FET Q7 is connected to common node N2 of FETs Q6 and Q7. Node N2 is connected to the output of NOR gate 62 through capacitor 64. Diode-connected FET Q7 and capacitor 64 constitute a so-called "pumping circuit." FETs Q6 and Q7 act as a voltage supply circuit for supplying third intermediate voltage Vm3 to corresponding bit line BL1 in accordance with the output signal of data discriminating circuit 56.

The operation modes of the EEPROM thus arranged above will now be described with reference to the timing chart of FIG. 5. In this drawing, a voltage on bit lines BL is represented by "Vbit"; voltages to be applied on gate control lines SG1 and SG2 via terminal SD1 and SD2 are represented by "Vsd1" and "Vsd2", respectively; voltages to be applied on word lines WL via terminal CG1, CG2, CG3, and CG4 are represented by "Vcg1", "Vcg2", "Vcg3" and "Vsd4", respectively. Voltages generated at terminals A, B, C, D, and E of "H" level voltage generator 50 and intermediate voltage generator 52 are represented by "Va", "Vb", "Vc", "Vd", and "Ve", respectively. An output voltage of NOR gate 62 provided in every intermediate voltage generator 52-i is represented by "Vgo": for example, the output voltage of circuit 52-1 is represented by "Vgo1", and the output voltage of circuit 52-2 is represented by "Vgo2".

The EEPROM performs data erasing for all the memory cells in the manner to be described below. When the EEPROM is set in the data erase mode, decoder circuit 48 supplies "L" level voltage VL to all the word lines WL. At the same time, "H" level voltage is applied to gate control terminal SD1 and all the bit lines BL. Selection transistors Qs11, Qs21, . . . are thus rendered conductive, so that each NAND cell block Bi is connected to the corresponding bit line BLi associated therewith. Memory cell transistors M11, M21, . . . , Mm1 have "H" level voltage at the drain diffusion layers thereof, and have "L" level voltage at the control gate of the memory cell transistors. As a result, electrons are released by Fowler-Nordhelm tunneling from floating gate 18 into substrate 10 in each of these memory cell transistors M. The threshold value of the transistors is shifted in the negative polarity direction to be, e.g., about −2 volts. This condition corresponds to the data "1"-storing state.

Subsequently, when "H" level voltage is applied by decoder 48 to word line WL1, each of memory cell transistors M11, M21, . . . , Mm1 has "H" level voltage at the drain diffusion layer thereof, since it is now connected to the corresponding bit line BLi associated therewith via one of memory cell transistors M11, M21, . . . , Mm1, which is rendered conductive. Each of these memory cell transistors M12, M22, . . . , Mm2 is "L" level voltage at control gate 22. As a result, in each of the transistors, electrons are released by Fowler-Nordhelm tunneling from floating gate 18 into substrate 10; its threshold value is thus shifted along the negative direction to reach −2 volts, for example. Such condition corresponds to the condition of storing data "1." The data erase may be completed by repeating the aforementioned voltage application steps in such a manner that the "H" level voltage is sequentially applied to word line, WL2, WL3, and WL4 in this order.

When the EEPROM is set in the data write mode, in order to write data into a desired memory cell Mij that is selected from among those of a certain NAND cell block, decoder 48 applies "H" level voltage to word line WLj which is connected to the selected memory cell Mij; it also applies the remaining word lines with second intermediate voltage Vm2 (=10 volts). At the same time, decoder 48 applies the bit line BLi, that is associated with the selected memory cell Mij, with either first intermediate voltage Vm1 or third intermediate voltage Vm3 in accordance with the logical level of the data to be written. The remaining bit lines kept non-selective are applied with third intermediate voltage Vm3, thereby to prevent "over-erasing" therein.

A description will now be given of a case wherein a memory cell M14 is selected and subjected to the data writing in the memory cell matrix shown in FIG. 1. In the following description, the operation of only two neighboring bit lines, i.e., bit line as a selected bit line and bit line as an unselected bit line will be explained only for the sake of simplicity; other unselected bit lines BL3, . . . , BLm are similar in their operation to bit line BL2.

Supplying signal $\overline{PRO}$ renders FETs S1 to S5 conductive. When voltage Vsd1 being applied to terminal SD1 changes to have second intermediate voltage Vm2 (=10 volts) as shown in FIG. 5, selection transistors Qs11 and Qs21 are rendered conductive (turned on), whereby each of NAND cell block B is electrically connected to the corresponding bit line BLi. In the case of memory cell M14 being selected and subjected to random data writing, word line ML4 and bit line BL1 are selected. "H" level voltage Vh is then applied to terminal CG4 of selected word line WL4, whereas second intermediate voltage Vm2 (=10 volts) is applied to terminal CG1 to CG4 of the remaining word lines WL1 to WL and terminal SD1 of gate control line SG1. As shown in FIG. 5, when data writing gets started at time t1, first intermediate voltage Vm1 is increased to have 6 volts. Gate terminals B and C of MOSFETs Q3 and Q4, which are rendered conductive only in the data read mode, and gate terminal A of MOSFET Q2, which is turned on only in the data erase mode, are maintained at the "L" level voltage.

With such a voltage application, selected bit line BL1 and unselected bit line BL2 (similarly to the other unselected bit lines) are first applied with a voltage lower than first intermediate voltage Vm1 by the threshold value of MOSFET Q1: the voltage is about 4 volts, for example. Meanwhile, the voltage on input/output line I/O1 of selected bit line BL1 becomes 5 volts, the voltage on input/output line I/O2 of unselected bit line BL2 becomes 0 volts, and voltage Vd of 5 volts is applied to gate terminal D of writing FET Q5 in each of control circuits 52-1 and 52-2; FET Q5 is thus rendered conductive. Accordingly, NOR gate 62 of control circuit 52-1 is applied at its first input with data voltage supplied by input/output line I/O1, and supplied at its second input with output voltage Ve (see FIG. 5) of the ring oscillator, which is supplied from terminal E. Similarly, NOR gate 62 of control circuit 52-2 receives at its first input data voltage supplied from input/output line I/O2; it receives at the second input thereof output voltage Ve that is supplied from terminal E. Supplying voltage Ve causes output voltage Vgo2 of NOR gate 62 of control circuit 52-2 (reference mark "Vgo2" does not appear in FIG. 1; however, that voltage is to correspond to "voltage Vgo1" generated at the corresponding node of circuit 52-1), which is connected to unselected bit line BL2, to increase, so that MOSFET Q7 is turned on. MOSFET Q6 is then turned on. As a result, third intermediate voltage Vm3 (=10 volts) is applied to this unselected bit line BL2.

Figure 5:
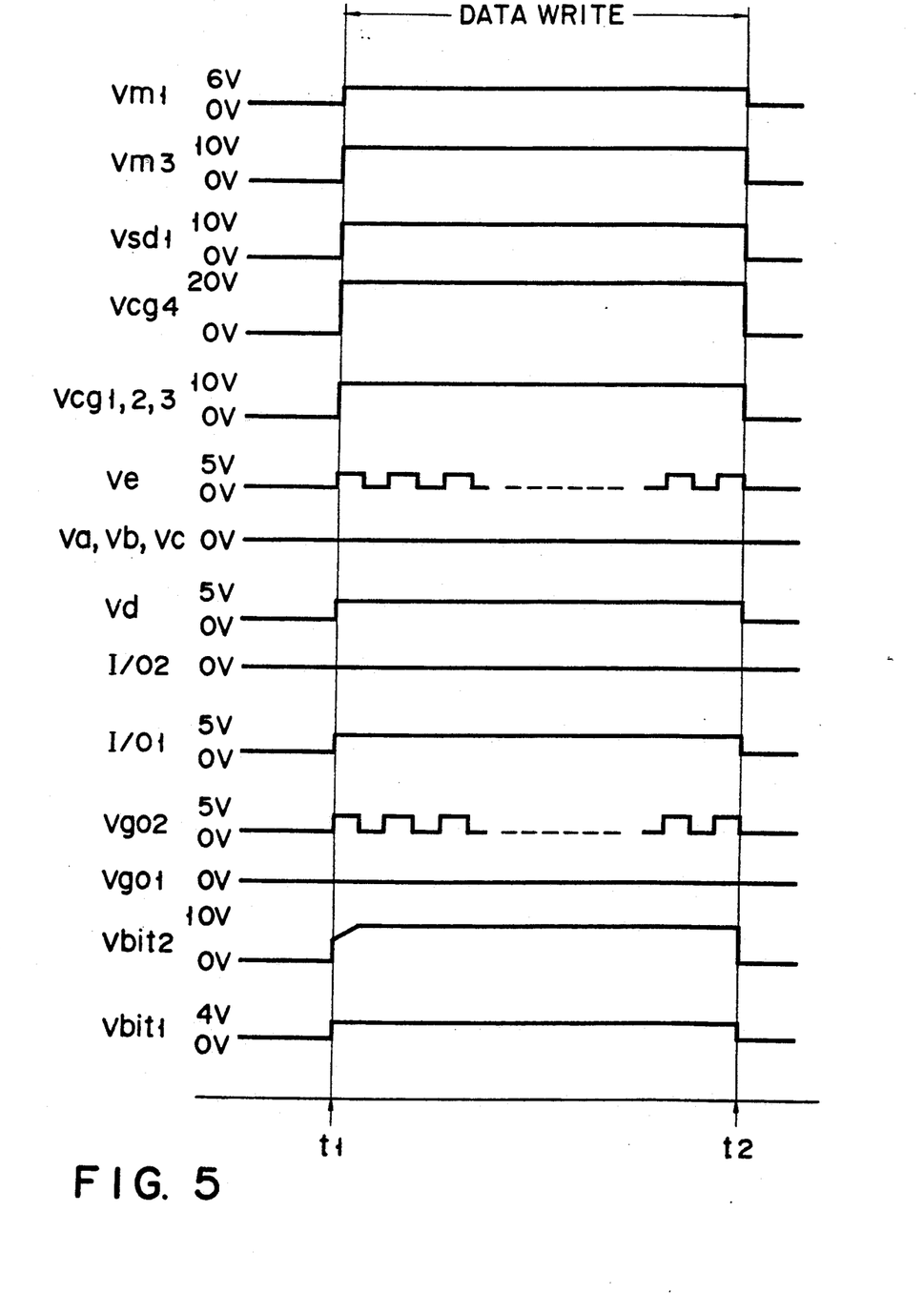
FIG. 5 is a diagram showing the waveforms of main electrical signals that are generated in main parts of the EEPROM in FIG. 1 in a data write mode thereof.

Therefore, with respect to NAND cell block B11 of selected bit line BL1, control gate voltages Vcg1, Vcg2, and Vcg3 of memory cell transistors M11 to M13 are set to second intermediate voltage Vm2 (=10 volts), as shown in FIG. 5. The channels of these memory cell transistors M becomes conductive, and the voltage lower by 2 volts than first intermediate voltage Vm1 (=6 volts), 4 volts, for example, is applied to selected bit line BL1; no charge carriers move in these memory cells M11 to M13, and no data voltage change occurs. In selected memory cell M14, control gate voltage Vcg4 is "H" level voltage (=20 volts), and its drain 38 (see FIG. 4) is applied with a voltage of about 4 volts which is transmitted thereto via cell transistors M11 to M13 being rendered conductive: actually, the voltage actually this voltage will be decreased because a slight voltage drop occurs in the channel of these memory cell transistors. Therefore, electrons being stored or accumulated in floating gate 18 of selected memory cell transistor M14 are released by F-N tunneling into substrate 10; thus, the threshold value of selected memory cell transistor M14 is shifted in the positive polarity direction to be +3 volts, for example. Writing logical data "0" is completed at this time.

During data writing with respect to selected bit line BL1, non-selected bit line BL2 is applied with third intermediate voltage Vm3 (=10 volts), since MOSFET Q6 of control circuit 52-2 is kept conductive. The "erroneous-writing" can be prevented or eliminated in unselected memory cells M21 to M24, for the following reason. If "L" level voltage VL (=0 volts) is used and if unselected bit line BL2 is set to the "L" level voltage, since word line WL4 has "H" level voltage Vh, memory cell M24 connected thereto will be set automatically in the data write mode: it causes erroneous data writing.

The following Table 1 summarizes the voltages applied to memory cells M11 to M14 of selected bit line BL1 and memory cells M21 to M24 of non-selected bit line BL2 in the data write mode of the EEPROM.

TABLE 1

|  | Control Gate Voltage | Drain Voltage |
| --- | --- | --- |
| Selected Cell M14 of Selected Bit Line BL1 | 20 V | 4 V |
| Unselected Cells M11-M13 of Selected Bit Line BL1 | 10 V | 4 V |
| Cell M24 of Non-selected Bit Line BL2 | 20 V | 10 V |
| Cells M21-M23 of Unselected Bit Line BL2 | 10 V | 10 V |

In the data read mode, if memory cell M14 is selected, a voltage of 0 volts is applied to word line WL4 which is connected to selected cell M14, and a voltage of 5 volts is applied to the remaining word lines WL1 to WL3, thereby to detect whether the selected cell M14 is turned on while non-selected memory cells M11 to M14 are turned on. If cell M14 is turned on, the storage data is discriminated to be logic "1"; the storage data is discriminated to be logic "0" if cell M14 is kept off.

Figure 6:
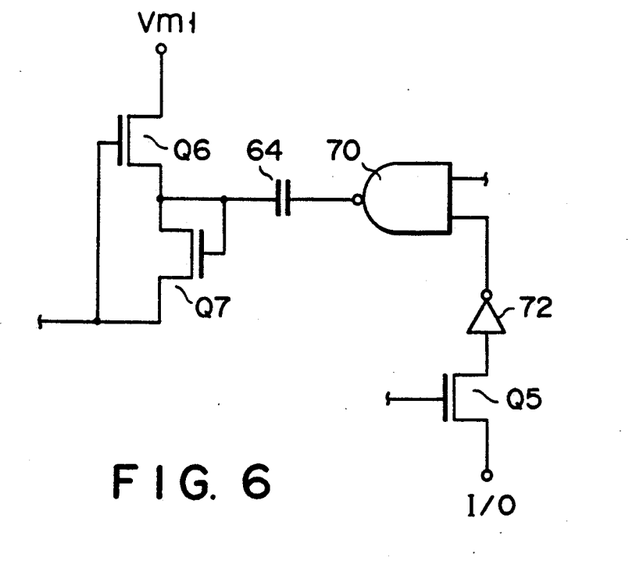
FIG. 6 i a diagram showing a modified circuit configuration of a peripheral control circuit of the EEPROM shown in FIG. 1.

In the above circuit configuration, NOR gate 62 of control circuit 52 may be replaced with a series circuit consisting of NAND gate 70 and inverter 72. In addition, the 6 volts voltage is used as first intermediate voltage Vm1 having the lowest voltage potential among intermediate voltages Vm; however, a power supply voltage Vcc (5 volts) of the EEPROM may be used as first intermediate voltage Vm1 in stead of the 6 volts voltage.

According to the first embodiment of the present invention, when random data writing is performed with respect to a desired memory cell Mij selected, one of two kinds of intermediate voltages (Vm1 and Vm3) having voltage potentials which are between the "H" level voltage and the "L" level voltage of the device are applied to selected bit line WLj in accordance with the logic level of data to be written in the selected memory cell. At this time, "H" level voltage Vh is applied only to a selected word line WLj; another intermediate voltage (Vm2) is applied to the remaining word lines, the another voltage having a voltage potential level that renders the non-selected memory cell transistors conductive. In the data write mode, since the "L" level voltage VL itself cannot be used at all, it is possible to effectively eliminate, by the back-biasing effect of applying voltage Vm1, the generation of undesirable "inversion phenomenon" in the field isolation region between adjacent memory cell transistors of NAND cell blocks of the selected bit line and of the neighboring bit line adjacent thereto, whereby current leakage therebetween can be minimized, as will be described in more detail hereinafter.

Figure 7:
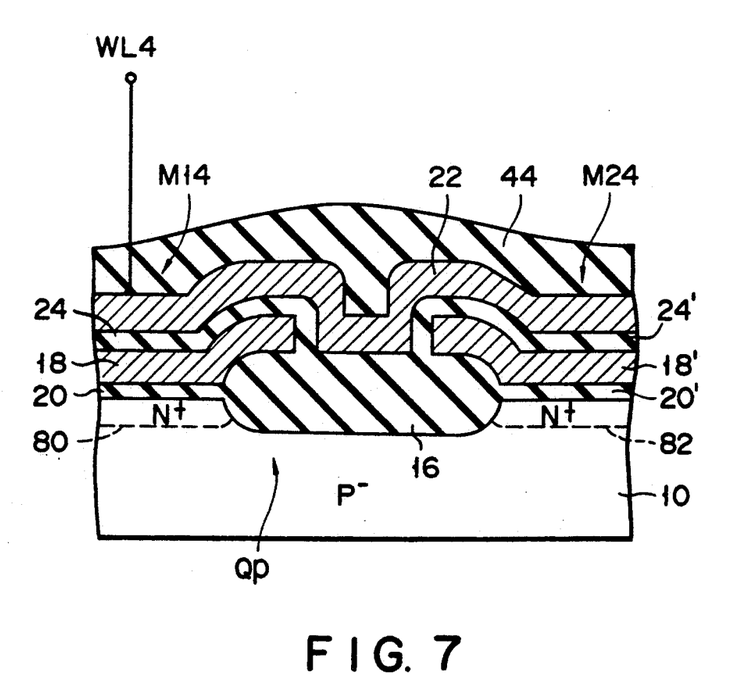
FIG. 7 is a diagram showing a parasitic transistor formed between neighboring NAND cell blocks in a filed isolation region of the EEPROM.

As shown in FIG. 7, field isolation layer 16 is formed between selected memory cell M14 and memory cell M24 adjacent thereto, which belong to neighboring bit lines BL1 and BL2 respectively, thereby to define a field isolation region. When data is written into the selected cell M14, "H" level voltage Vh is applied to word line WL4. A MOS type parasitic transistor Qp is thus formed which has word line WL4 serving as its gate electrode, N+ type active layer of memory cell M14 serving as its drain, and N+ type active layer 82 of neighboring memory cell M24 as its source. Under such a condition, if "L" level voltage is applied to the selected bit line BL1, and if a normal intermediate voltage (typically, 6 volts) is applied to unselected bit lines BL2, parasitic transistor Qp is set in such state that it is 0 volts at the source, 6 volts at the drain, and 2 volts at the gate electrode thereof. The channel region of parasitic transistor Qp which is positioned just under field insulation layer 16 is inverted; transistor Qp is thus rendered conductive (turned on), which accelerates leak current to flow between memory cells M14 and M24. Such phenomenon is the "inversion beneath field isolation region."

In the aforementioned embodiment, "L" level voltage VL is not used in the data writing operation; intermediate voltages Vm1, Vm2, and Vm3 are used instead in combination with "H" level voltage Vh. Using the intermediate voltages can cause the voltage difference between source 80 and drain 82 of parasitic transistor Qp to be much decreased than that in the conventional case. Therefore, even if "H" level voltage Vh (=20 volts) is applied to the gate electrode (WL4) of the parasitic transistor Qp, this transistor will not be turned on by the back-basing effect; current leakage can thus be prevented or eliminated. This means that the dielectric isolation ability between the neighboring bit lines BL can be enhanced. It is therefore possible to minimize the generation of data programming errors in the data write mode, whereby the operational reliability of the EEPROM can be much improved.

Attention should be paid to the fact that the specific "data writing voltage control" feature of the present invention described above also provides the following unexpected results: it allows common use of voltages both in the data erase mode and in the programming mode, so that the type of drive voltages necessary for data accessing operation of the EEPROM can be reduced. All of these drive voltages are produced by boosting an externally supplied power supply voltage Vcc using a booster circuit that is provided in the EEPROM; therefore, the reduction of drive voltage types may lead to simplification of the circuit configuration of the booster circuit, which will serve to save the chip substrate area and thus to improve the integration density of the EEPROM.

With the first embodiment described above, MOSFET T1 of circuits 51 for supplying first intermediate voltage Vm1 is used in such a manner that the gate and drain thereof are connected together in common; d.c. current path will never be formed at all at the side of third intermediate voltage Vm3 that is higher in potential level than first intermediate voltage Vm1.

The aforementioned "field isolation inversion preventing" concept of the present invention may also be applied to NAND cell type EEPROMs of well structure: an embodiment having such an arrangement will now be described hereinafter with reference to FIG. 8. Note that in FIG. 8 similar reference numerals are used to designate similar components corresponding to those shown in FIG. 1, and that the detailed description therefor will be omitted only for the sake of simplification of description.

Figure 8:
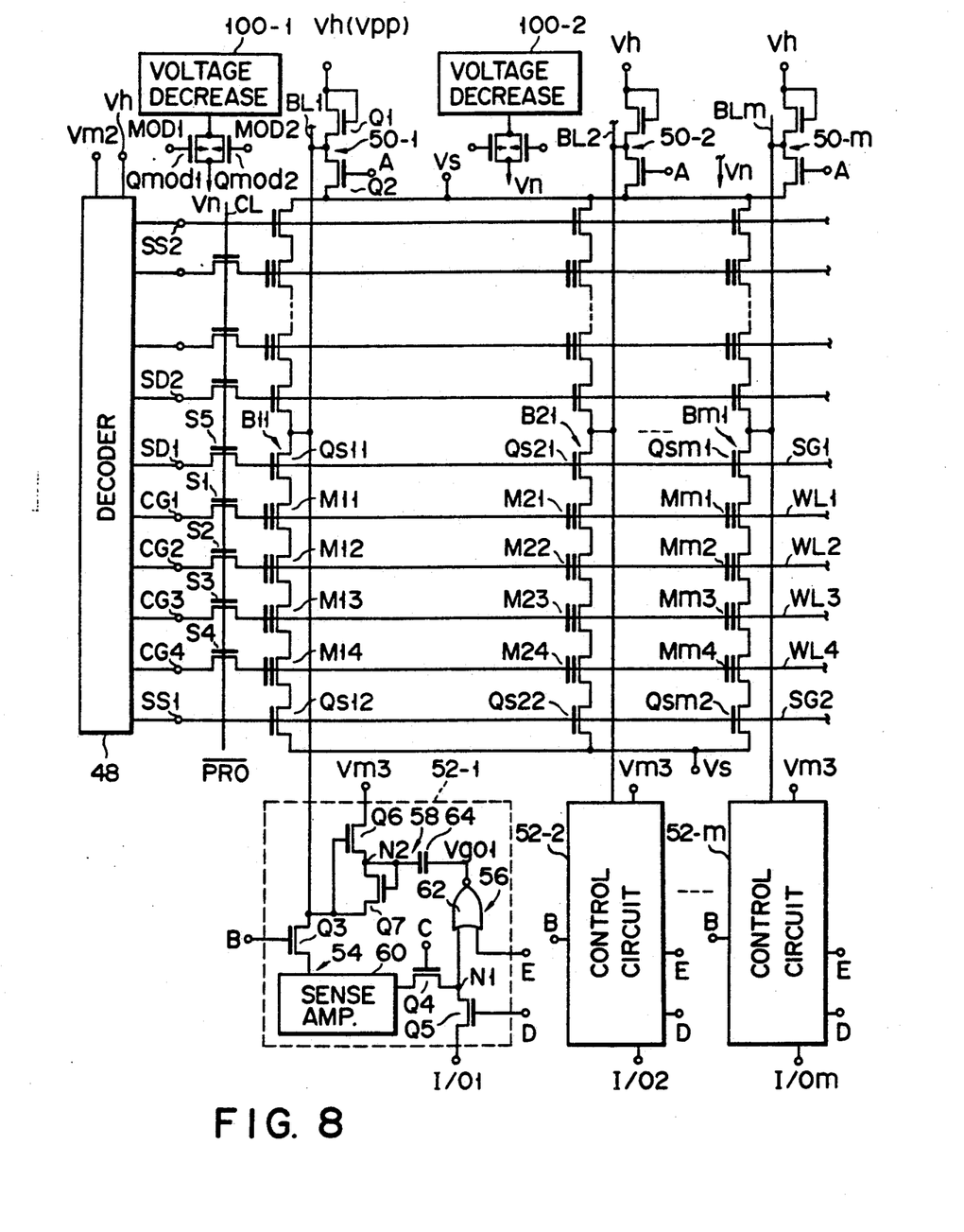
FIG. 8 is a diagram showing the main part of a circuit arrangement of an electrically erasable programmable read-only memory (EEPROM) in accordance with a second embodiment of the present invention.

As shown in FIG. 8, a voltage decreasing circuit 100-i (i=1, 2, ...) is provided with respect to every bit line BLi to produce negative polarity voltage Vn that has a decreased potential level of the negative polarity, for example $-3$ volts. This negative polarity voltage Vn is to be used in the data write and read modes of the EEPROM. Circuit 100-i is connected via a couple of parallel-connected MOSFETs Qmod1 and Qmod2 to a semiconductor well region, which will be described hereinafter. MOSFETs Qmod1 and Qmod2 are responsive to mode control signals MOD1 and MOD2, respectively. Mode control signal MOD1 is supplied when the EEPROM is set in the data write mode, whereas signal MOD2 is supplied when the EEPROM is in the data read mode.

Figure 9:
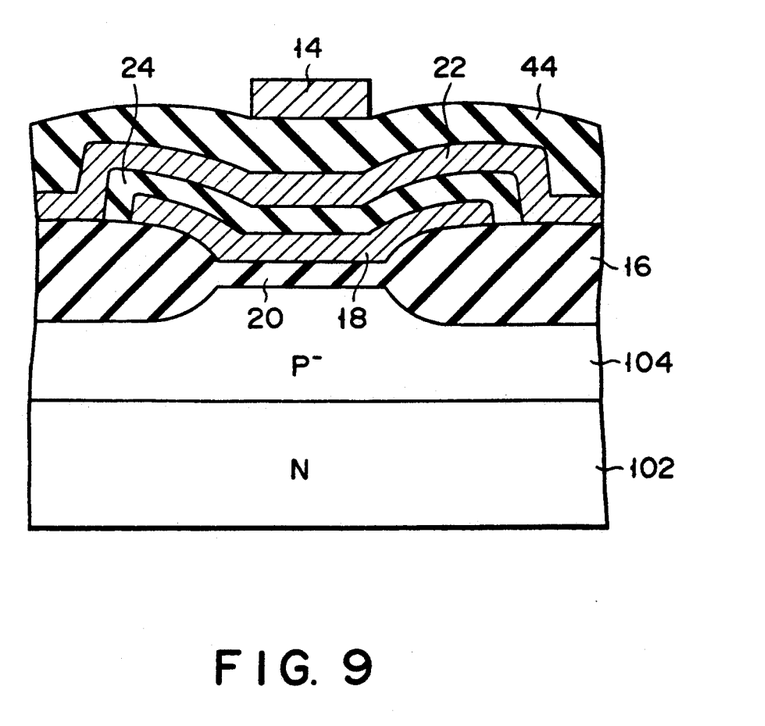
FIGS. 9 and 10 are diagrams showing cross-sectional views of the EEPROM shown in FIG. 8.
Figure 10:
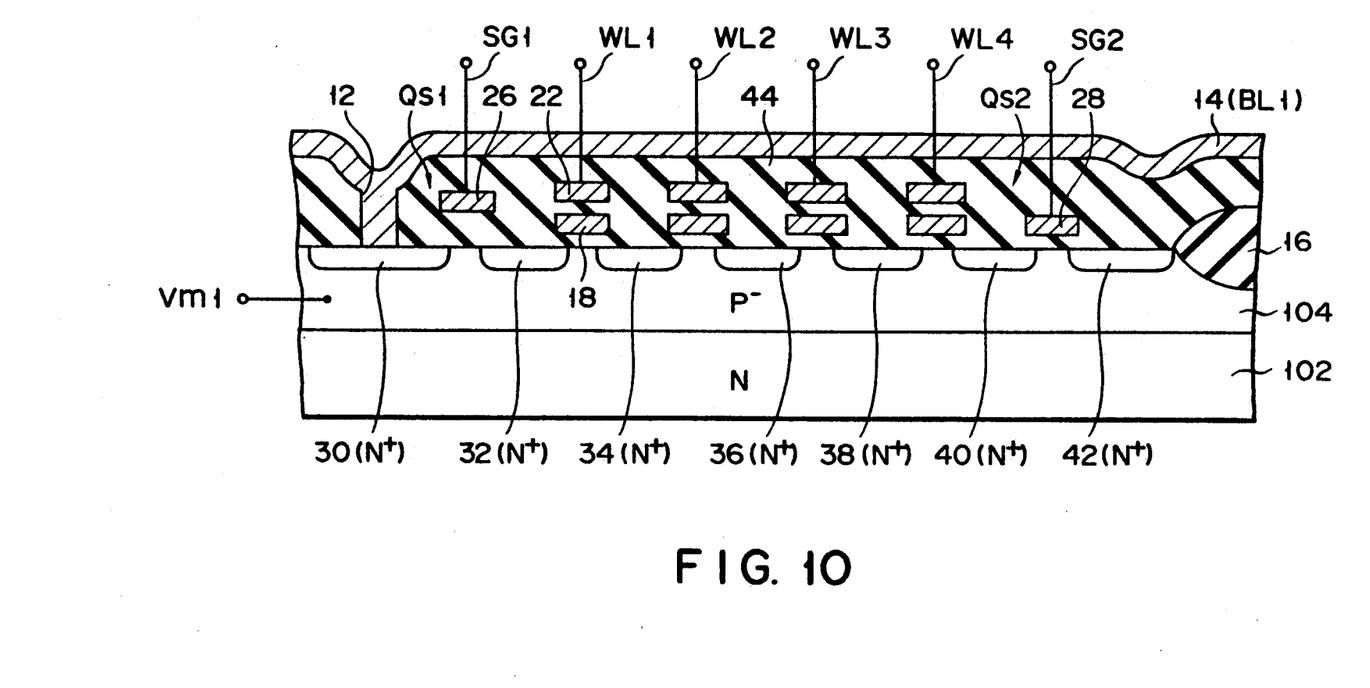

The EEPROM has a semiconductor substrate 102 of P type conductivity, in which the aforementioned semiconductor well region is formed which is of the opposite conductivity type thereto; that is, P- type. The well region is designated by reference numeral "104" in FIGS. 9 and 10, which show the cross-sectional views of the EEPROM corresponding to FIGS. 3 and 4, respectively. It is to be understood from viewing FIG. 10 that NAND cell block Bi having selection transistors Qs and memory cell transistors M is formed in well region 104 in essentially the same manner as in the previous embodiment. When MOSFETs Qmod1 and Qmod2 are rendered conductive, the output voltage Vn (=$-3$ volts) of circuit 100-i is transmitted via MOSFETs Qmod1 and Qmod2 to well region 104 of a corresponding NAND cell block Bi.

Decoder circuit 48 is provided to apply each of lines WL and SG with one of "H" level voltage Vh (=20 volts) and second intermediate voltage Vm2 (=10 volts), selectively. Second intermediate voltage Vm2 is used in the data write mode; "H" level voltage Vh is used in both the data write mode and the data erase mode in the same manner as in the first embodiment. Each bit line BLi is connected with voltage generator circuit 50-i and peripheral circuit 52-i: circuit 50 generates boosted voltage Vpp as "H" level voltage Vh; circuit 52-i produces third intermediate voltage Vm3 (=10 volts).

The second embodiment is fundamentally same as the first embodiment in its voltage application technique for performing data erasing and reading operations; it is technically different from the first embodiment in that it performs a specific data write operation as will be described as follows.

In the data write mode, when data is written into a desired memory cell Mij that is selected from among those of a certain NAND cell block, well region 104 is applied with voltage Vn so that the voltage potential thereof is kept at $-3$ volts. Decoder 48 applies "H" level voltage Vh to a word line WLj which is connected to the selected memory cell Mij, and applies second intermediate voltage Vm2 (=10 volts) to the remaining unselected word lines. At the same time, decoder 48 applies the bit line BLi that is associated with the selected memory cell Mij with either third intermediate voltage Vm3 or "L" level voltage VL in accordance with the logical level of the data to be written into the selected memory cell. The remaining unselected bit lines are applied with third intermediate voltage Vm3, thereby to prevent the "erroneous data writing."

Figure 11:
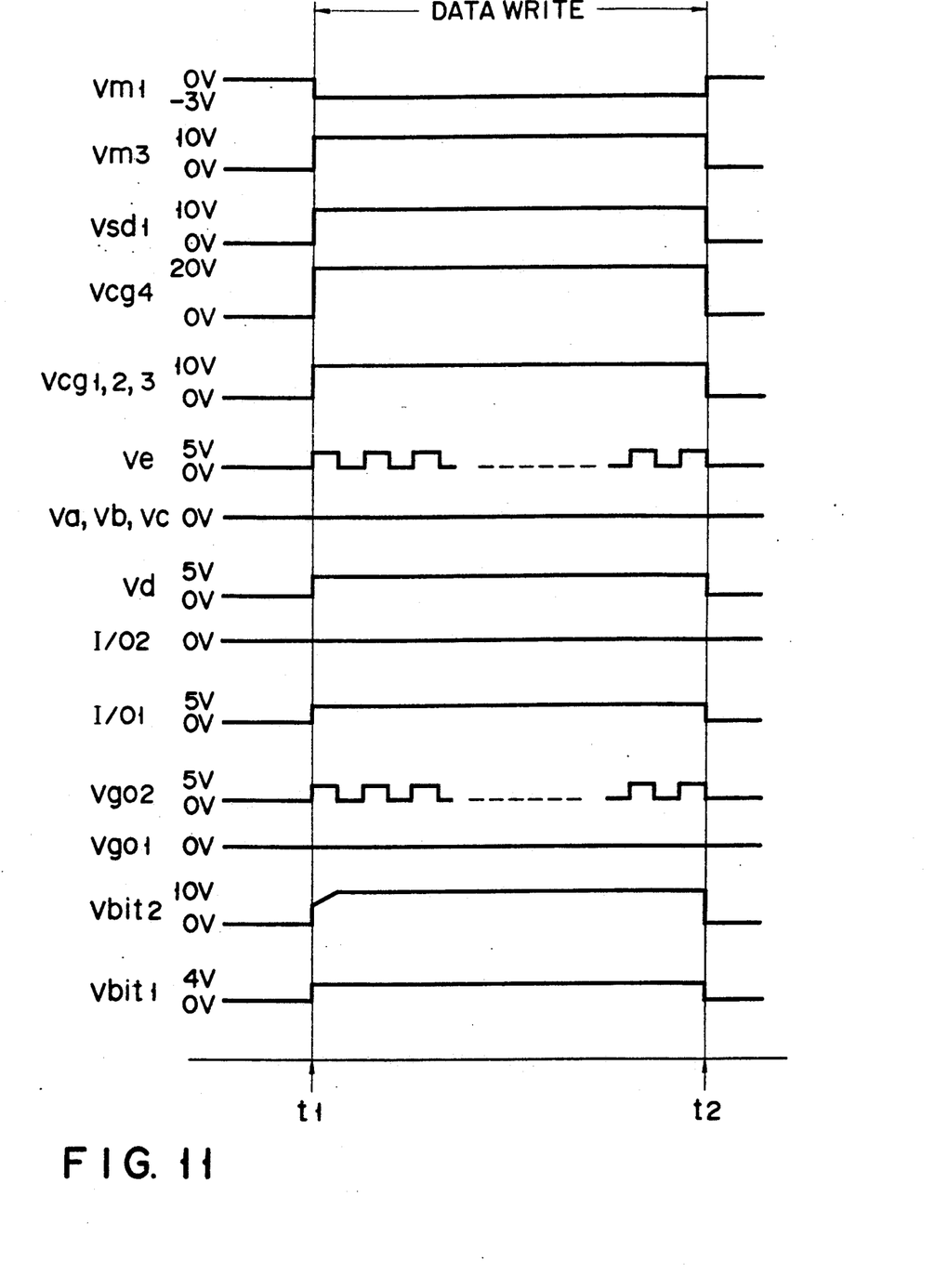
FIG. 11 is a diagram showing the waveforms of main electrical signals that are generated in main parts of the EEPROM in FIG. 8 in a data write mode thereof.

More specifically, a case will be explained in which memory cell M14 is typically selected in the memory cell matrix shown in FIG. 8 and data writing is performed with respect to the memory cell M14. Signal PRO is supplied to line CL, so that FETs S1 to S5 are rendered conductive. Voltage Vsd1 being applied to terminal SD1 is changed at time t1 to have second intermediate voltage Vm2, as shown in FIG. 11. In response to the signal, selection transistors Qs11 and Qs21 are turned on, whereby each of NAND cell block B is electrically connected to the corresponding bit line BLi. In the case of memory cell M14 being as the selected cell into which data is written, word line WL4 and bit line BL1 are selected Terminal CG4 of selected word line WL is then applied with "H" level voltage; whereas, terminals CG1 to CG3 of the remaining word lines WL1 to WL3 are applied with second intermediate voltage Vm2 (=10 volts). Gate terminals B and C of MOSFETs Q3 and Q4, which are rendered conductive only in the data read mode, and gate terminal A of MOSFET Q2, which is turned on only in the data erase mode, are constantly maintained at the "L" level voltage.

Meanwhile, input/output line I/O1 connected to selected bit line BL1 is held at 5 volts, and input/output line I/O2 connected to unselected bit line BL2 is held at 0 volts. Voltage Vd of 5 volts is applied to gate terminal D of writing MOSFET Q5 in each of control circuits 52-1 and 52-2. FET Q5 is then rendered conductive. NOR gate 62 of control circuit 52-1 is thus applied at the first input thereof with data voltage supplied from input/output line I/O1; it is applied at the second input with output voltage Ve (see FIG. 11) of the ring oscillator, which is supplied from terminal E. Similarly, NOR gate 62 of control circuit 52-2 is applied at the first input thereof with data voltage supplied from input/output line I/O2, and is applied at the second input thereof with output voltage Ve of the ring oscillator, which is supplied from terminal E. Supplying voltage Ve causes output voltage Vgo2 of NOR gate 62 of control circuit 52-2 (reference mark "Vgo2" does not appear in FIG. 1; however, that voltage is to correspond to "voltage Vgo1" generated at the corresponding node of circuit 52-1), which is connected to unselected bit line BL2, to increase, so that MOSFET Q7 is turned on. MOSFET Q6 is then turned on. As a result, third intermediate voltage Vm3 (=10 volts) is applied to this unselected bit line BL2.

Therefore, with respect to NAND cell block B11 of selected bit line BL1, control gate voltages Vcg1, Vcg2, and Vcg3 of memory cell transistors M11 to M13 are held at second intermediate voltage Vm2 (=10 volts), as shown in FIG. 11. The channels of these memory cell transistors M becomes conductive, and the "L" level voltage VL (=0 volts) is applied to selected bit line BL1; no charge carriers move in these memory cells M11 to M13, so that no data voltage change occurs. In selected memory cell M14, control gate voltage Vcg4 is held at "H" level voltage (=20 volts), and its drain 38 (see FIG. 10) is held at 0 volts. As a result, electrons being stored or accumulated in the drain diffusion layer of selected memory cell transistor M14 are injected by F-N tunneling into its floating gate 18; thus, the threshold value of selected memory cell transistor M14 is shifted in the positive polarity direction to be +3 volts, for example. Writing logical data "0" is completed at this time.

During data writing at the selected bit line BL1, MOSFET Q6 of control circuit 52-2 is kept conductive (turned on), so that non-selected bit line BL2 is receiving third intermediate voltage Vm3 (=10 volts). Data writing error may be eliminated in unselected memory cells M21 to M24 due to the same reason as in the previous embodiment.

The following Table summarizes the voltages applied to memory cells M11 to M14 of selected bit line BL1 and memory cells M21 to M24 of non-selected bit line BL2 in the data write mode of the EEPROM.

TABLE 2

|  | Control Gate Voltage | Drain Voltage | Well Potential |
|---|---|---|---|
| Selected Cell M14 of Selected Bit Line BL1 | 20 V | 0 V | −3 V |
| Unselected Cells M11–M13 of Selected Bit Line BL1 | 10 V | 0 V | −3 V |
| Cell M24 of Non-selected Bit Line BL2 | 20 V | 10 V | −3 V |
| Cells M21–M23 of Unselected Bit Line BL2 | 10 V | 10 V | −3 V |

According to the second embodiment arranged as described above, when data is written into a desired selected memory cell Mij, P type well region 104 in which the selected cell is formed is maintained at the negative polarity voltage Vn, −3 volts, for example, even when "L" level voltage VL is being applied to the selected bit line BLi. With such an arrangement, a parasitic transistor Qp is "back-biased," which is formed in the filed isolation region between the selected memory cell transistor (M14) and neighboring memory cell transistor (M24) adjacent thereto as illustrated in FIG. 7; such back-basing serves to prevent the parasitic transistor from being turned on easily. This may enable to eliminate current leakage between adjacent NAND cell blocks, whereby programming error can be minimized in the data write mode, so that the operational reliability of the EEPROM can be much improved.

The present invention is not limited to the above-described specific embodiments and may be practiced or embodied in still other ways without departing from the spirit or essential character thereof. For example, the above embodiment may be modified so that the voltage Vbit1 applied to the bit line BL1 during the aforementioned data write mode is constantly maintained at 0 volts, as shown in FIG. 12.

What is claimed is:

1. A non-volatile semiconductor memory device comprising:

a semiconductive substrate;

bit lines on said substrate;

word lines insulatively crossing said bit lines to define crossing points therebetween on said substrate;

an array of memory cells at the crossing points on said substrate, each of said memory cells including one transistor with a carrier storage layer and a control gate;

said array of memory cells including two adjacent, first and second memory cell transistors which are connected at their control gates in common to one of said word lines and which have heavily-doped semiconductive regions that define a source and a drain of a transistor structure for turning on, when one of these memory cell transistors is selected for data write, so that leak current flows therebetween;

leak current eliminator means for forcing said transistor structure to turn off during data write for the selected memory cell transistor, by causing potential difference between said heavily-doped semiconductive regions to be low enough to render said transistor structure nonconductive even when a highest voltage is applied to said one of said word lines which serves as a gate electrode of said transistor structure; and said leak current eliminator means causing the potential difference to decrease by increasing a lower one of voltage potentials at said heavily-doped regions, while said transistor structure is rendered nonconductive.

2. The device according to claim 1, wherein said leak current eliminator means applies to one of said certain heavily-doped regions an intermediate voltage which has a potential intermediate between the highest voltage (Vh) and a lowest voltage (VL) of said device.

3. The device according to claim 2, wherein said array of memory cells are arranged in a plurality of memory cell units each of which has a series-circuit of a preselected number of memory cell transistors having carrier storage layers and control gates, said word lines being connected to said control gates.

4. The device according to claim 1, wherein said substrate comprises a semiconductor well region of a certain conductivity type opposite to that of said substrate, said array of memory cells being arranged in the well region.

5. The device according to claim 4, further comprising:

means for applying to said well region a voltage of negative polarity while the selected memory cell transistor is subjected to data write.

6. The device according to claim 4, wherein said memory cell transistors comprise floating gate tunneling field effect transistors.

7. An electrically programmable non-volatile semiconductor memory comprising:

a semiconductive substrate;

parallel data transfer lines on said substrate;

parallel program lines insulatively crossing said data transfer lines to define crossing points therebetween on said substrate;

a plurality of memory cells at the crossing points on said substrate, said memory cells being arranged in a plurality of memory cell units each of which has a series-circuit of a preselected number of memory cell transistors having carrier storage layers, control gates, and heavily-doped regions in said substrate, said program lines being connected to said control gates;

write controller means connected to said data transfer lines and program lines, for writing data into a selected memory cell transistor, by providing said program lines and said data transfer lines with specific voltages having a highest potential level and a plurality of intermediate potential levels which are defined between the highest potential level and a lowest potential level of said semiconductor memory;

said write controller means preventing the heavily-doped regions of the selected cell transistor and a neighboring cell transistor thereof from having applied thereto the lowest potential level of said semiconductor memory while data is written into said selected cell transistor.

8. The memory according to claim 7, wherein said memory is adapted to be supplied with an external power supply voltage, said highest potential level is higher than the power supply voltage, said lowest potential level is lower than said power supply voltage.

9. The memory according to claim 8, wherein said intermediate potential levels include a first, a second, and a third d.c. potential level, at least one of which is lower than said power supply voltage.

10. The memory according to claim 8, wherein said intermediate potential levels includes a first, a second, and a third d.c. potential level, one of which is lower than said power supply voltage, and the remaining ones of which are higher than said power supply voltage.

11. The memory according to claim 8, wherein said plurality of memory cell units are arranged in a top surface portion of said substrate which is prevented from being provided with a semiconductive well region.

12. The memory according to claim 8, further comprising:

a semiconductive well region of a certain conductivity type opposite to that of said substrate, said plurality of memory cell units being arranged in said well region.

13. The memory according to claim 8, wherein said plurality of memory cells comprise floating gate field effect transistors.

14. An electrically erasable and programmable read-only memory system comprising:

an array of rows and columns of memory cells arranged in a plurality of memory cell units each of which has a plurality of memory cell transistors each having heavily-doped semiconductive regions in said substrate, a carrier storage layer and a control gate;

bit lines associated with said memory cell units;

word lines connected to the control gates of the rows of said memory cell transistors; and write controller means connected to said data transfer lines and program lines, for forcing carriers to move to or from the carrier storage layer of a selected memory cell transistor to write data thereinto, by providing said bit lines and said word lines with specific voltages including a high-level voltage and a plurality of intermediate voltages which are defined between the high-level voltage and a low-level voltage, one of said intermediate voltages having a potential lower than that of an external power supply voltage applied to said array.

15. The system according to claim 14, wherein said write controller means prevents the heavily-doped regions of said memory cell transistors including the selected cell transistor and a neighboring cell transistor thereof, which are connected to one of said word lines, from having applied thereto the low-level voltage while data is written into said selected cell transistor.

16. The system according to claim 15, wherein said write controller means applies to said selected cell transistor and said neighboring cell transistor a voltage having a potential lower than that of the external power supply voltage.

17. The system according to claim 14, wherein said intermediate voltages have a first, a second, and a third d.c. potential level, one of which is lower than said power supply voltage, and the remaining ones of which are higher than said power supply voltage.

18. The system according to claim 14, further comprising a semiconductor substrate, said memory cell units being arranged in a top surface portion of said substrate which is prevented from being provided with a semiconductive well region.

19. The system according to claim 14, further comprising:
 a semiconductor substrate; and
 a semiconductive well region of a certain conductivity type opposite to that of said substrate, said memory cell units being arranged in said well region.

20. The system according to claim 14, wherein said memory cells comprise floating gate field effect transistors.

21. A non-volatile semiconductor memory device comprising:
 a semiconductive substrate having a top surface that is free from additional doping of impurity;
 parallel bit lines on said substrate;
 parallel word lines insulatively crossing said bit lines to define crossing points therebetween on said substrate;
 an array of memory cells at the crossing points on said top surface of said substrate, each of said memory cells including one transistor with a carrier storage layer and a control gate;
 said array of memory cells including two adjacent, first and second memory cell transistors which are connected at their control gates in common to one of said word lines and which have heavily-doped semiconductive regions that define a source and a drain of a transistor structure for turning on, when one of these memory cell transistors is selected for data write, so that leak current flows therebetween;
 leak current eliminator means for forcing said transistor structure to turn off during data write for the selected memory cell transistor, by causing potential difference between said heavily-doped semiconductive regions to be low enough to render said transistor structure nonconductive even when a highest voltage is applied to said one of said word lines which serves as a gate electrode of said transistor structure; and
 means for applying to said substrate a voltage of negative polarity while the selected memory cell transistor is subjected to a write operation.

* * * * *

UNITED STATES PATENT AND TRADEMARK OFFICE
CERTIFICATE OF CORRECTION

PATENT NO. : 5,088,060
DATED : February 11, 1992
INVENTOR(S) : Tetsuo Endoh et al It is certified that error appears in the above-identified patent and that said Letters Patent is hereby corrected as shown below:

On the title page, after item [63] please insert the following:

--[30] Foreign Application Priority Data
    March 8, 1989   [JP]   Japan.................1-55472
    Ausust 31, 1989 [JP]   Japan....................1-225425 --.

Signed and Sealed this

Fourth Day of May, 1993

Attest:

MICHAEL K. KIRK

Attesting Officer

Acting Commissioner of Patents and Trademarks